United States Patent
Loo et al.

(10) Patent No.: US 11,569,791 B2
(45) Date of Patent: Jan. 31, 2023

(54) PLANARIZATION METHOD

(71) Applicant: AAC ACOUSTIC TECHNOLOGIES (SHENZHEN) CO., LTD., Shenzhen (CN)

(72) Inventors: Lieng Loo, Singapore (SG); Kahkeen Lai, Singapore (SG); Yilei Wu, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 249 days.

(21) Appl. No.: 17/136,049

(22) Filed: Dec. 29, 2020

(65) Prior Publication Data

US 2021/0336596 A1 Oct. 28, 2021

(30) Foreign Application Priority Data

Apr. 23, 2020 (CN) .......................... 202010327549.7

(51) Int. Cl.
*H03H 3/02* (2006.01)
*H03H 9/17* (2006.01)
*H03H 9/56* (2006.01)
*H01L 41/22* (2013.01)

(52) U.S. Cl.
CPC ............... *H03H 3/02* (2013.01); *H01L 41/22* (2013.01); *H03H 9/173* (2013.01); *H03H 9/564* (2013.01); *H03H 2003/021* (2013.01); *Y10T 29/42* (2015.01); *Y10T 29/49005* (2015.01)

(58) Field of Classification Search
CPC ... Y10T 29/42; Y10T 29/49005; H01L 41/23; H01L 41/25; H01L 41/297; H01L 41/331; H01L 41/332; H01L 41/47; H03H 3/02; H03H 2003/021; H03H 2003/023
See application file for complete search history.

(56) References Cited

U.S. PATENT DOCUMENTS

2003/0117041 A1* 6/2003 Kurihara ................ B41J 2/1646
                                                              257/E27.006
2005/0179508 A1* 8/2005 Sato ........................ H03H 3/02
                                                              333/187

* cited by examiner

*Primary Examiner* — Peter Dungba Vo
*Assistant Examiner* — Joshua D Anderson
(74) *Attorney, Agent, or Firm* — W&G Law Group

(57) ABSTRACT

The invention provides a planarization method, which can make the local flatness of the product to be processed more uniform. The product has a cavity filled with oxide and includes a first electrode layer, a piezoelectric layer and a second electrode layer superposed on the cavity. The first electrode layer covers the cavity and includes a first inclined face around the first electrode layer, and the piezoelectric layer covers the first electrode layer and is arranged on the first electrode layer. The planarization method includes: depositing a passivation layer on the second electrode layer and etching the passivation layer completely until the thickness of the passivation layer is reduced to the required thickness.

9 Claims, 2 Drawing Sheets depositing a passivation layer on the second electrode layer for covering the second electrode layer and the piezoelectric layer; the passivation layer is provided with a first plane part, a fourth inclined surface part arranged on the periphery of the first plane part, and a second plane part extending from the fourth inclined surface part; a projection of the first plane part in a vertical direction covers the cavity; an orthographic projection of the fourth inclined surface part in the vertical direction falls outside the cavity — S100 totally etching the passivation layer until a thickness of the passivation layer is reduced to a predetermined thickness — S200 releasing the oxide in the cavity for obtaining a finished product — S300

Fig. 1

PLANARIZATION METHOD

FIELD OF THE PRESENT DISCLOSURE

The invention relates to the technical field of planarization processing methods, in particular to a planarization method.

DESCRIPTION OF RELATED ART

In the prior art, a product requiring planarization processing is usually implemented through a CMP (chemical mechanical polishing) process, and the CMP process has the following problems:

1. The CMP process is relatively complicated and relatively high in cost.
2. The CMP process has requirements for materials, and multiple materials are not suitable for the CMP process, for example, aluminum nitride is not a common material for the CMP process, and silicon nitride is difficult to process for the CMP process.
3. The conventional CMP process is to planarize the whole to-be-processed product in the planarization process.

Therefore, it is necessary to provide a novel planarization method for solving the problems.

SUMMARY OF THE PRESENT INVENTION

One of the major objects of the present invention is to provide a planarization method that is capable of simple operation, high practicability and easy controlling in the implementation process.

Accordingly, the present invention provides a planarization method for partially planarizing a surface of a to-be-processed product having a cavity filled with an oxide, a first electrode layer covering the cavity and having a first inclined surface part positioned on a periphery of the first electrode layer, a piezoelectric layer covering the first electrode layer and having a second inclined surface part according to the first inclined surface part, and a second electrode layer covering a part of the piezoelectric layer and having a third inclined surface part positioned on a periphery of the second electrode layer; wherein the planarization method comprises steps of:

depositing a passivation layer on the second electrode layer for covering the second electrode layer and the piezoelectric layer; the passivation layer is provided with a first plane part, a fourth inclined surface part arranged on the periphery of the first plane part, and a second plane part extending from the fourth inclined surface part; a projection of the first plane part in a vertical direction covers the cavity; an orthographic projection of the fourth inclined surface part in the vertical direction falls outside the cavity; and totally etching the passivation layer until a thickness of the passivation layer is reduced to a predetermined thickness.

In addition, the fourth inclined surface part is formed on the passivation layer due to the presence of the third inclined surface part; and a fifth inclined surface part arranged on the periphery of the second plane part is also formed on the passivation layer due to the presence of the second inclined surface part.

In addition, after totally etching on the passivation layer, the planarization method further comprises the following process: releasing the oxide in the cavity for obtaining a finished product.

In addition, the implementation way of total etching for the passivation layer is total dry etching or total wet etching.

In addition, an aluminum nitride material is adopted by the passivation layer.

In addition, an orthographic projection of the second electrode layer in the vertical direction falls inside the cavity.

In addition, the to-be-processed product further comprises a seed layer arranged between the first electrode layer and the cavity.

In addition, the aluminum nitride material is adopted by the seed layer.

In addition, the to-be-processed product is a filter.

BRIEF DESCRIPTION OF THE DRAWINGS

Many aspects of the exemplary embodiments can be better understood with reference to the following drawings. The components in the drawing are not necessarily drawn to scale, the emphasis instead being placed upon clearly illustrating the principles of the present disclosure.

FIG. 1 is a flowchart of a planarization method in an embodiment of the invention.

DETAILED DESCRIPTION OF THE EXEMPLARY EMBODIMENT

Figure 2:
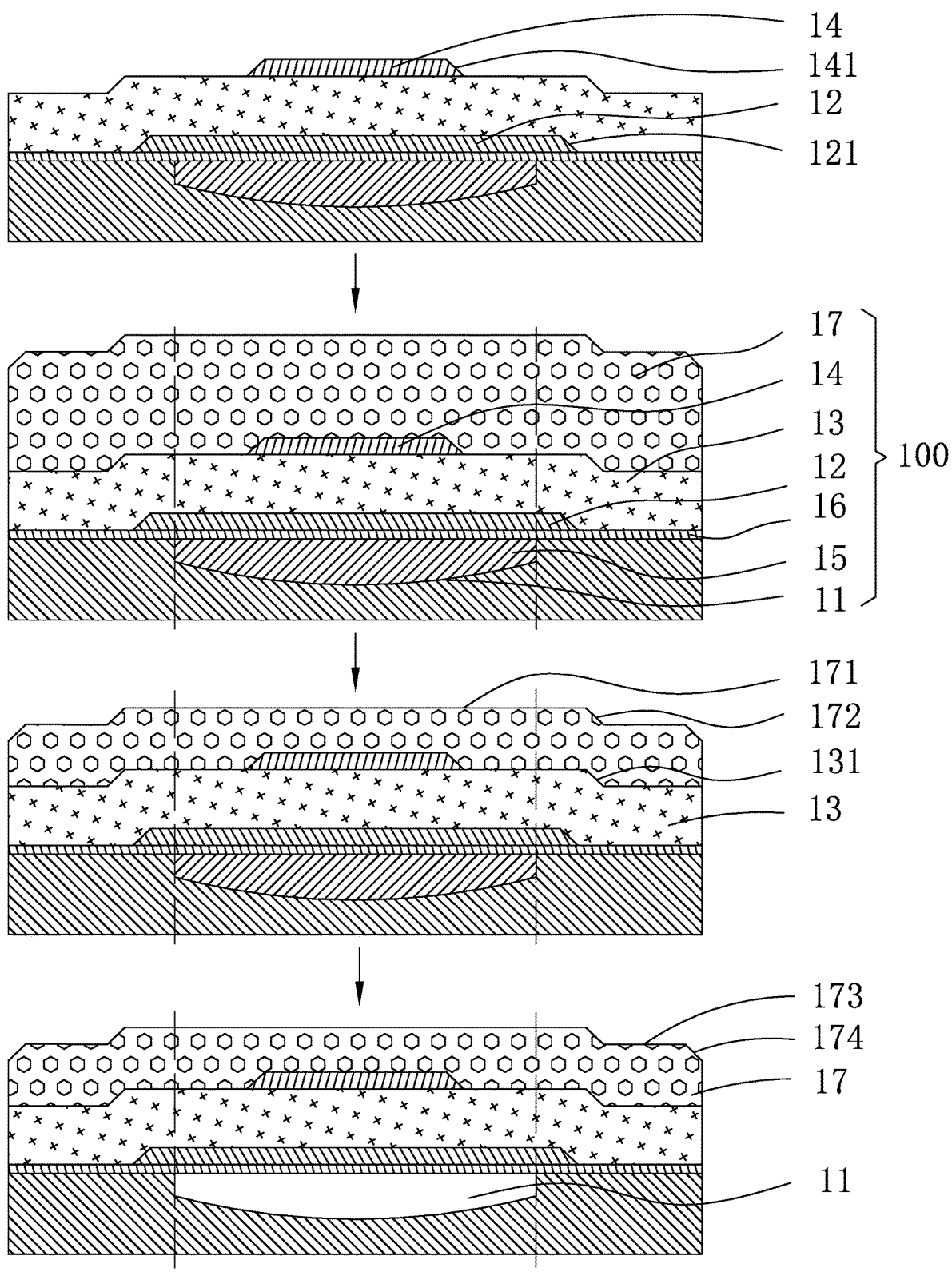
FIG. 2 is a process diagram of the planarization method in the embodiment of the invention.

The present disclosure will hereinafter be described in detail with reference to an exemplary embodiment. To make the technical problems to be solved, technical solutions and beneficial effects of the present disclosure more apparent, the present disclosure is described in further detail together with the figure and the embodiment. It should be understood the specific embodiment described hereby is only to explain the disclosure, not intended to limit the disclosure.

The invention will be further described below with reference to the drawings and embodiment.

It should be noted that, all directional instructions in the embodiment of the invention (such as upper, lower, left, right, front, rear, inside, outside, top and bottom) are used only for explaining relative positional relationships between various components in a particular attitude (as shown in the drawings), and the like. If the particular attitude is changed, the directional instructions are changed accordingly.

It should be further noted that, when an element is referred to as being "fixed" or "arranged" on another element, it may be directly on the other element or intervening elements may be present at the same time. When an element is referred to as being "connected" on another element, it may be directly connected to the other element or intervening elements may be present at the same time.

Embodiment

As shown in FIG. 1 and FIG. 2, the embodiment of the invention provides a planarization method, which is used for planarizing a to-be-processed product 100, such as a filter. The to-be-processed product 100 is provided with a cavity 11 filled with an oxide 15. The to-be-processed product 100 comprises a first electrode layer 12, a piezoelectric layer 13 and a second electrode 14 which are stacked on the cavity 11; the first electrode layer 12 covers the cavity 11 and comprises a first inclined surface part 121 positioned on the periphery of the first electrode layer 12; the piezoelectric layer 13 covers the first electrode layer 12, and due to the first inclined surface part 121, a second inclined surface part 131 is formed on the piezoelectric layer 13 on the surface of the first inclined surface part; the second electrode layer 14 covers part of the piezoelectric layer 13 and comprises a third inclined surface part 141 positioned on the periphery of the second electrode layer 14; and the orthographic projection of the second electrode layer 14 in the vertical direction falls inside the cavity 11. The planarization method comprises the steps:

S100, a passivation layer 17 is deposited on the second electrode layer 14, wherein a PVD deposition method or CVD deposition method can be adopted as the deposition mode, and which deposition mode will be used depends on the type and applicability of a required thin film; the passivation layer 17 covers the second electrode layer 14 and the piezoelectric layer 13; the passivation layer 17 is provided with a first plane part 171, a fourth inclined surface part 172 arranged on the periphery of the first plane part 171, a second plane part 173 extending from the fourth inclined surface part 172, and a fifth inclined surface part 174 arranged on the periphery of the second plane part 173; the projection of the first plane part 171 in the vertical direction covers the cavity 11; due to the presence of the third inclined surface part 141, the fourth inclined surface part 172 is formed on the passivation layer 17; the orthographic projection of the fourth inclined surface part 172 in the vertical direction falls outside the cavity 11; and furthermore, due to the presence of the second inclined surface part 131, the fifth inclined surface part 174 is formed on the passivation layer 17.

In this process, the passivation layer 17 needs to have an enough thickness to enable the orthographic projection of the fourth inclined surface part 172 in the vertical direction to fall outside the cavity 11; the final thickness of the typical passivation layer 17 is usually in the range of 100-300 nm; and the initial thickness of the passivation layer 17 deposited by the method may be in the range of 300-1,000 nm, the specific thickness depends on the thickness (namely, the overall thickness of the first electrode layer 12, the piezoelectric layer 13 and the second electrode layer 14 in the embodiment) of a stack while the thickness of the stack is determined according to actual requirements.

S200, total etching is carried out on the passivation layer 17 until the thickness of the passivation layer 17 is reduced to the required thickness, for example, the required thickness of the typical passivation layer 17 is in the range of 100-300 nm; the final required thickness of the passivation layer 17 depends on the thickness (namely, the overall thickness of the first electrode layer 12, the piezoelectric layer 13 and the second electrode layer 14 in the embodiment) of the stack while the thickness of the stack is determined according to the actual requirements.

The implementation way of total etching for the passivation layer 17 is total dry etching or total wet etching, the total etching described herein refers to etching the passivation layer 17 from top to bottom at the same etching rate, that is to say, the shape of the passivation layer 17 is not changed before and after the etching, and only the thickness is changed. Therefore, compared with a CMP process, the planarization method is smaller in planarized area and can achieve better uniformity control in the planarization process.

Furthermore, in the total etching method, an etching material is not excessively limited, for example, an aluminum nitride material or silicon nitride material is not suitable for the CMP process while the aluminum nitride material or silicon nitride material is not limited for the total etching method, therefore, the aluminum nitride material can be adopted by the passivation layer 17.

S300, the oxide 15 in the cavity 11 is released to obtain a finished product.

Furthermore, the to-be-processed product further comprises a seed layer 16 arranged between the first electrode layer 12 and the cavity 11. In the embodiment, the aluminum nitride material can be adopted by the seed layer 16.

The planarization method provided by the embodiment is simple in operation, high in practicability and easier to control in the implementation process, and can achieve better local planarization. Furthermore, the planarization method is not limited to the material of the to-be-processed product 100 and is wide in application range.

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A planarization method, comprising:
providing a product having a cavity filled with an oxide, a first electrode layer covering the cavity and having a first inclined surface part positioned on a periphery of the first electrode layer, a piezoelectric layer covering the first electrode layer and having a second inclined surface part overlapping the first inclined surface part, and a second electrode layer covering a part of the piezoelectric layer and having a third inclined surface part positioned on a periphery of the second electrode layer;
depositing a passivation layer on the second electrode layer for covering the second electrode layer and the piezoelectric layer; the passivation layer is provided with a first plane part, a fourth inclined surface part arranged on the periphery of the first plane part, and a second plane part extending from the fourth inclined surface part; a projection of the first plane part in a vertical direction covers the cavity; an orthographic projection of the fourth inclined surface part in the vertical direction falls outside the cavity; and
etching an entire surface of the passivation layer at the same rate until a thickness of the passivation layer is reduced to a predetermined thickness.

2. The planarization method as described in claim 1, wherein the fourth inclined surface part is formed on the passivation layer due to the presence of the third inclined surface part; and a fifth inclined surface part arranged on the periphery of the second plane part is formed on the passivation layer due to the presence of the second inclined surface part.

3. The planarization method as described in claim 1, further comprising: after etching the entire surface of the passivation layer, releasing the oxide in the cavity for obtaining a finished product.

4. The planarization method as described in claim 1, wherein the etching of the entire surface of the passivation layer comprises total dry etching or total wet etching.

5. The planarization method as described in claim 1, wherein the passivation layer is formed of an aluminum nitride material.

6. The planarization method as described in claim 1, wherein an orthographic projection of the second electrode layer in the vertical direction falls inside the cavity.

7. The planarization method as described in claim 1, wherein the product further comprises a seed layer arranged between the first electrode layer and the cavity.

8. The planarization method as described in claim 7, wherein the seed layer is formed of an aluminum nitride material.

9. The planarization method as described in claim 1, wherein the product is a filter.

* * * * *